United States Patent

Cooper

[11] Patent Number: 6,166,665
[45] Date of Patent: Dec. 26, 2000

[54] DATA COMPRESSION METHOD AND APPARATUS WITH EMBEDDED RUN-LENGTH ENCODING

[75] Inventor: Albert B. Cooper, New York City, N.Y.

[73] Assignee: Unisys Corporation, Blue Bell, Pa.

[21] Appl. No.: 09/264,269

[22] Filed: Mar. 8, 1999

[51] Int. Cl.[7] .................................................. H03M 7/46
[52] U.S. Cl. .............................................. 341/63; 341/87
[58] Field of Search ................................. 341/51, 63, 87; 358/261.1

[56] References Cited

U.S. PATENT DOCUMENTS

| | | | |
|---|---|---|---|
| 4,929,946 | 5/1990 | O'Brien et al. | 341/87 |
| 4,971,407 | 11/1990 | Hoffman | 341/87 |
| 4,988,998 | 1/1991 | O'Brien | 341/55 |
| 5,247,638 | 9/1993 | O'Brien et al. | 395/425 |
| 5,389,922 | 2/1995 | Seroussi et al. | 341/51 |
| 5,764,167 | 6/1998 | Adams et al. | 341/63 |
| 5,861,827 | 1/1999 | Welch et al. | 341/51 |

FOREIGN PATENT DOCUMENTS

WO 00/02319  1/2000  WIPO .

OTHER PUBLICATIONS

Internet site: http://www.boutell.com/gd, pp. 1–3.

Primary Examiner—Howard L. Williams
Attorney, Agent, or Firm—Albert B. Cooper; Mark T. Starr; Rocco L. Adornato

[57] ABSTRACT

The disclosed data compressor receives an input stream of data characters and provides a corresponding stream of output codes. The compressor generates a sequence of numerically increasing output codes corresponding to numerically increasing contiguous segments of a detected run of the same data character. Non-run characters of the input stream are transmitted directly in synchronism with incrementing the codes of the code sequence. In one embodiment, the number of characters in the run segments are stored together with the respective codes representing the segments. In later encounters of a previously processed run, the stored data is accessed and the stored codes corresponding to the run segments are output as appropriate.

27 Claims, 7 Drawing Sheets

INPUT DATA CHARACTER STREAM $a_1\ a_2\ a_3\ a_4\ a_5\ a_6\ a_7\ a_8\ a_9\ a_{10}\ a_{11}\ a_{12}\ a_{13}\ w\ x\ y\ z\ d\ b_1\ b_2\ b_3\ b_4\ b_5\ b_6$

| ACTIONS | CURRENT CHARACTER | n | LOOK-AHEAD CHARACTERS | OUTPUT | CODE COUNTER | DISCARD CHARACTERS | BLOCKS OF FIG. 2 |
|---|---|---|---|---|---|---|---|
| 1 | $a_1$ | 2 | $a_2\ a_3$ | $a_1$ | 258 | | 30-35 |
| 2 | | | | 258 | 259 | $a_2\ a_3$ | 50-54 |
| 3 | | 3 | $a_4\ a_5\ a_6$ | 259 | 260 | $a_4\ a_5\ a_6$ | 55, 56, 50-54 |
| 4 | | 4 | $a_7\ a_8\ a_9\ a_{10}$ | 260 | 261 | $a_7\ a_8\ a_9\ a_{10}$ | 55, 56, 50-54 |
| 5 | | 5 | $a_{11}\ a_{12}\ a_{13}\ w\ x$ | | 262 | | 55-59 |
| 6 | $a_{11}$ | 2 | $a_{12}\ a_{13}$ | $a_{11}$ | | | 60, 33-35 |
| 7 | | | | 262 | 263 | $a_{12}\ a_{13}$ | 50-54 |
| 8 | | 3 | w x y | | 264 | | 55-59 |
| 9 | w | 2 | x y | w | | | 60, 33-35 |
| 10 | x | . | y z | x | 265 | | 36-39, 34, 35 |
| 11 | y | | z d | y | 266 | | 36-39, 34, 35 |
| 12 | z | | d $b_1$ | z | 267 | | 36-39, 34, 35 |
| 13 | d | | $b_1\ b_2$ | d | 268 | | 36-39, 34, 35 |
| 14 | $b_1$ | | $b_2\ b_3$ | $b_1$ | 269 | | 36-39, 34, 35 |
| 15 | | | | 269 | 270 | $b_2\ b_3$ | 50-54 |
| 16 | | 3 | $b_4\ b_5\ b_6$ | 270 | 271 | $b_4\ b_5\ b_6$ | 55, 56, 50-54 |
| 17 | | 4 | | | | | 55 |

*Figure 3*

INPUT DATA CHARACTER STREAM $a_1\ a_2\ a_3\ a_4\ a_5\ a_6\ a_7\ a_8\ a_9\ a_{10}\ a_{11}\ a_{12}\ w\ x\ y\ z\ a_{13}\ a_{14}\ a_{15}\ a_{16}\ a_{17}\ a_{18}\ a_{19}\ a_{20}\ a_{21}$

| ACTIONS | CURR CHAR | n | FLAG | LOOK-AHEAD CHARACTERS | OUTPUT | CODE COUNTER | DISCARD CHARACTERS | TABLE CODE | TABLE COUNT | R | M | BLOCKS OF FIG. 6 |
|---|---|---|---|---|---|---|---|---|---|---|---|---|
| 1 | $a_1$ | | set | $a_2$ | | 258 | | | | | | 30,31,90,32,91 |
| 2 | | 2 | reset | $a_2\ a_3$ | $a_1$ | | | | | | | 92,33,35,94,95 |
| 3 | | | | | 258 | 259 | $a_2\ a_3$ | 258 | 2 | | | 50,96,51-54 |
| 4 | | 3 | | $a_4\ a_5\ a_6$ | 259 | 260 | $a_4\ a_5\ a_6$ | 259 | 3 | | | 55,97,50,96,51-54 |
| 5 | | 4 | | $a_7\ a_8\ a_9\ a_{10}$ | 260 | 261 | $a_7\ a_8\ a_9\ a_{10}$ | 260 | 4 | | | 55,97,50,96,51-54 |
| 6 | | 5 | | $a_{11}\ a_{12}\ w\ x\ y$ | | 262 | | | | | | 55,97,57-59 |
| 7 | $a_{11}$ | | | $a_{12}$ | | 263 | $a_{12}$ | | | 2 | 4 | 100,91,92,110-112 |
| 8 | | | | | 258 | | | | | | | 113-117 |
| 9 | w | | | x | w | 264 | | | | | | 118,91,93,36-38 |
| 10 | x | | | y | x | 265 | | | | | | 39,91,93,36-38 |
| 11 | y | | | z | y | 266 | | | | | | 39,91,93,36-38 |
| 12 | z | | | $a_{13}$ | z | 267 | | | | | | 39,91,92,110-112 |
| 13 | $a_{13}$ | | | $a_{14}$ | | | | | | | | 130,131 |
| 14 | | | | | 260 | | $a_{14}\ a_{15}\ a_{16}$ | | | 9 | 4 | 132,97 |
| 15 | | 5 | | $a_{17}$–$a_{21}$ | | | | | | | | 50,96,51-54 |
| 16 | | | | | 267 | 268 | $a_{17}$–$a_{21}$ | 267 | 5 | | | 55 |
| 17 | | 6 | | | | | | | | | | |

*Figure 7*

DATA COMPRESSION METHOD AND APPARATUS WITH EMBEDDED RUN-LENGTH ENCODING

BACKGROUND OF THE INVENTION

1. Field of the Invention

The invention relates to data compression particularly with respect to providing data compression embodiments with embedded run-length encoding that have heretofore not been developed in the prior art.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF and TIFF image communication protocols.

Another type of data compression and decompression, denoted as Run-Length Encoding (RLE), compresses a repeating character run by providing a compressed code indicating the character and the length of the run. RLE is thus effective in encoding long strings of the same character. For example, RLE is effective in compressing a long sequence of blanks that may be included at the beginning of a data file. RLE is also effective in image compression where an image contains a long run of consecutive pixels having the same value, such as in the sky portion of a land-sky image.

In the prior art, run-length encoding has been combined with an LZ system by applying the data to a run-length encoder and then applying the run length encoded data to the LZ based system. In such an architecture, a run-length encoder is utilized at the front end of the compressor and a run-length decoder is utilized at the output end of the decompressor. Such a system suffers from the disadvantages of increased equipment, expense, control overhead and processing time.

Run-length encoding has also been included in the LZW based system of U.S. Pat. No. 5,389,922 by Seroussi et al, issued Feb. 14, 1995. In the system of this patent certain output codes from the compressor are suppressed in the presence of a run of repeating input data characters. A special run enhancement engine is utilized at the input to the decompressor to regenerate the missing codes.

Another data compression and decompression system involving the encoding of data character runs is disclosed in U.S. Pat. No. 5,861,827 by Welch et al., issued Jan. 19, 1999. In the compressor of this system, when a partial string W and character C are found, a new string is stored with C as an extension character on the string PW where P was the string conveyed in the last transmitted output compressed code. With this compression algorithm, a run of characters is encoded in two compressed codes regardless of its length. The decompressor of this system uses a special unrecognized code process to maintain synchronism with the compressor.

It is an object of the present invention to provide further data compression embodiments that utilize run-length encoding.

SUMMARY OF THE INVENTION

The compressor of the present invention generates a sequence of numerically increasing output codes corresponding to numerically increasing contiguous segments of a run of data characters. Consecutive characters that differ with respect to each other are transmitted directly and in synchronism with incrementing the compressor code counter.

BRIEF DESCRIPTION OF THE DRAWINGS

FIG. 3 is a chart exemplifying the operations of the compressor of FIG. 1 in accordance with the control flow chart of FIG. 2.

FIG. 7 is a chart exemplifying the operations of the compressor of FIGS. 4 and 5 in accordance with the control flow chart of FIG. 6.

DESCRIPTION OF THE PREFERRED EMBODIMENTS

Figure 1:
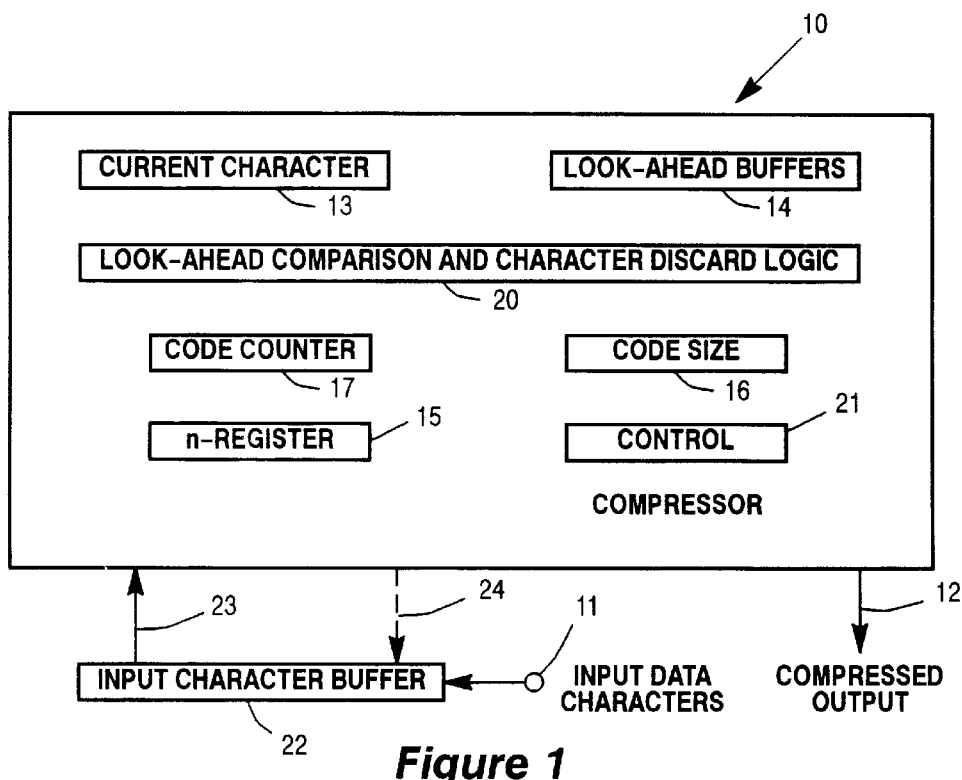
FIG. 1 is a schematic block diagram of a data compressor providing a preferred embodiment of the present invention.

Referring to FIG. 1, a data compressor 10 is illustrated that compresses a stream of input data characters applied at an input 11 into a stream of corresponding compressed codes at an output 12. The compressor 10 includes working registers denoted as a Current Character register 13, Look-Ahead Buffers 14, an n-register 15 and a Code Size register 16. The compressor 10 further includes a Code Counter 17 for sequentially generating code values that are used to process run segments and non-run characters in a manner to be described.

The compressor 10 further includes look-ahead comparison and character discard logic 20. The logic 20 performs comparisons between a character in the Current Character register 13 and the characters in the Look-Ahead Buffers 14 and discards look-ahead characters in a manner to be described. The compressor 10 also includes control 21 for controlling the operations of the compressor in accordance with the operational flow chart of FIG. 2 in a manner to be described.

Further included is an Input Character Buffer 22 that buffers the input data character stream received at the input 11. The individual input data characters are applied from the Input Character Buffer 22 via a bus 23 to the Current Character register 13 and to the Look-Ahead Buffers 14 in accordance with operations to be described. The compressor 10 controls acquiring input data characters from the Input Character Buffer 22 via a control bus 24.

Briefly, the operation of the compressor 10 is as follows. Input data characters are fetched from the Input Character Buffer 22 to the Current Character register 13 and to the Look-Ahead Buffers 14 permitting the logic 20 to perform a comparison between Current Character and the next two look-ahead characters. If the three characters are the same, run processing is performed. Otherwise, the character in the Current Character register 13 is output and the next character following Current Character is fetched into the Current Character register 13.

If a character run is detected, the character beginning the run, residing in the Current Character register 13, and the code in the Code Counter 17 are output. The Code Counter 17 is then incremented by 1. The run is then examined to determine if numerically increasing run segments exist in the run. Specifically, it is determined if contiguous run segments of three characters, four characters, five characters, six characters etc., exist in the run following the two look-ahead characters that follow and match the character in the Current Character register 13. For each such detected run segment, the code in the Code Counter 17 is output and the Code Counter 17 is incremented by 1. The process is continued until insufficient characters remain in the run to populate the next run segment in the sequence. When this occurs, the Code Counter 17 is again advanced by 1.

The Current Character register 13, the Look-Ahead Buffers 14, the n-register 15 and the logic 20 are utilized in performing the character run processing as explained below with respect to FIG. 2.

Figure 2:
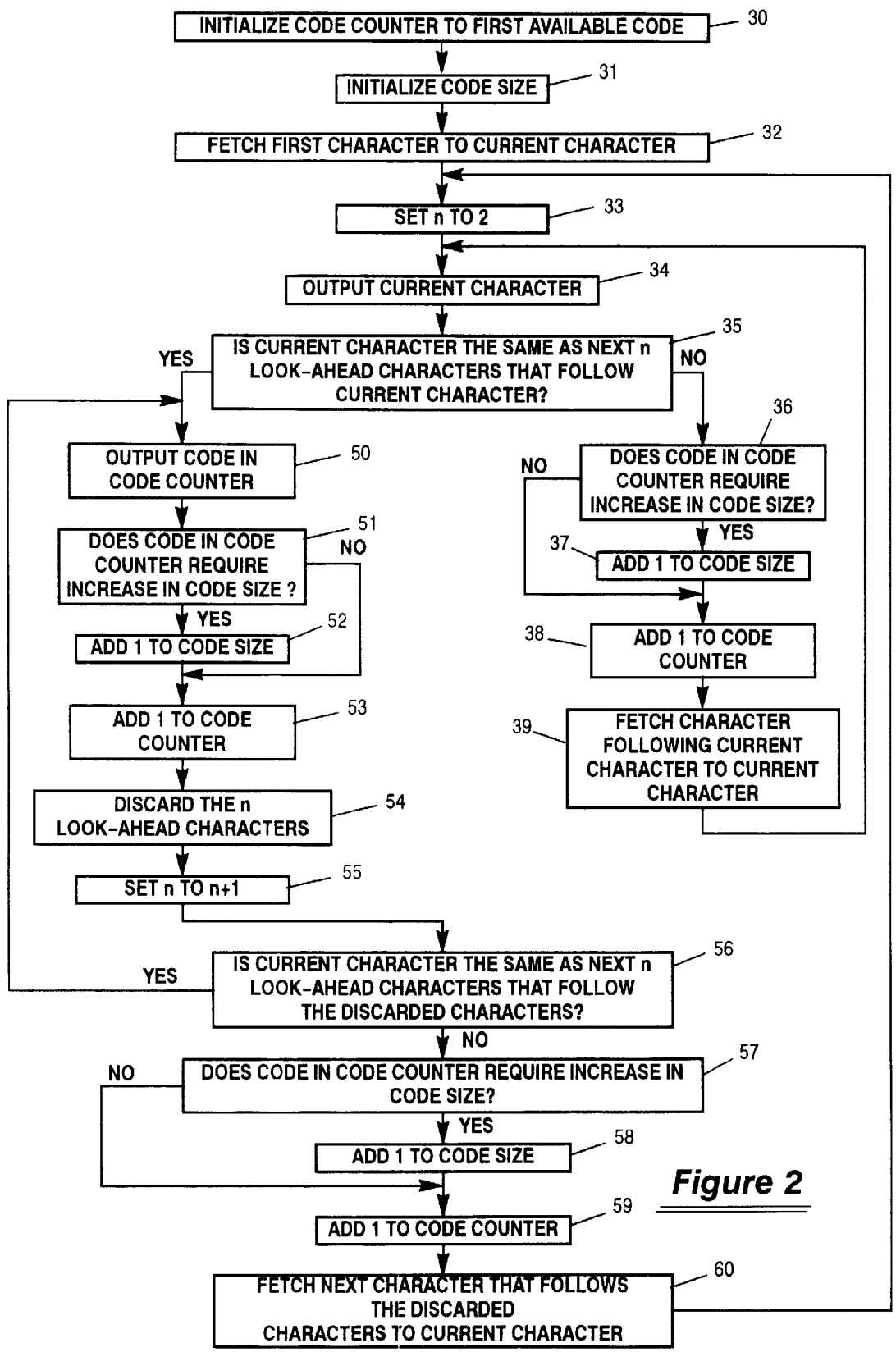
FIG. 2 is a control flow chart illustrating the operations executed by the compressor of FIG. 1 so as to perform data compression in accordance with the present invention. The embodiment of FIGS. 1 and 2 is a non-storage configuration where character runs are newly processed each time they are encountered.

Referring to FIG. 2, with continued reference to FIG. 1, a control flow chart is illustrated showing the detailed operations to be executed by the compressor 10 so as to perform data compression in accordance with the invention. The control 21 is considered as containing appropriate circuitry such as state machines to control execution of the operations.

The flow chart of FIG. 2 is predicated on a variable length output and the Code Size register 16 is utilized to this effect. As is well known, for example, in an ASCII implementation having an 8 bit alphabet, the Code Size may begin with 9 bits and sequentially increase to 10, 11, 12, etc. bits at codes 512, 1024, 2048, etc., respectively.

Accordingly, at a block 30 the Code Counter 17 is initialized to a first available code, for example, 258 in an ASCII environment. At a block 31, the Code Size register 16 is initialized to the beginning Code Size, for example, 9 bits in the ASCII embodiment.

At a block 32, the first input character is fetched into Current Character register 13 and at a block 33 the n-register 15 is set to 2. At a block 34, the character in the Current Character register 13 is provided to the output 12. It is appreciated that even though this character has been output it still resides in the Current Character register 13.

Processing continues at a block 35 wherein the Current Character in the register 13 is tested against the next n look-ahead characters that follow Current Character to determine if they are the same. This process is performed by the logic 20 utilizing the appropriate characters fetched into the Look-Ahead Buffers 14. Since "n" had been set to 2, the block 35 compares the Current Character to the next 2 look-ahead characters that follow Current Character.

It is appreciated that block 35 determines if a run of the same character is about to commence. If the Current Character is the same as the next two look-ahead characters, run processing begins by taking the YES branch of block 35. If one of the two look-ahead characters does not match Current Character, the NO branch of block 35 is taken to perform non-run processing.

It is appreciated in the logic of FIG. 2 that when the block 35 determines that a character run is about to occur (YES branch), the character in the Current Character register 13 should be output. Similarly, when the block 35 determines that a run is not about to occur (NO branch) that, again, the current character should be output. For economy, since the current character is output irrespective of which branch is taken, block 34 performs the action prior to the decision of block 35.

If the non-run processing NO branch is taken from the block 35, the Current Character has already been output at block 34. At a block 36, the code in Code Counter 17 is tested to determine if an increase in the Code Size is required. If so, processing continues to a block 37 wherein the Code Size register 16 is incremented by 1. If an increase in Code Size is not required, block 37 is bypassed to continue processing at a block 38. At block 38 the Code Counter 17 is incremented by 1 in synchronism with the Current Character outputting of block 34.

Processing continues with a block 39 whereat the character following the Current Character is fetched to the Current Character register 13. Control then returns to the block 34 whereat the processing of the input data is continued.

When the decision of the block 35 indicates that a run of the same character is beginning, the YES branch is taken to a block 50. At the block 50 the code in the Code Counter 17 is provided at the output 12 of the compressor 10. At this point in the control flow, the first three characters of the potential run have been processed. The initial character of the run is in the Current Character register 13 and has been outputted at the block 34. The code in the Code Counter 17 that is outputted at block 50 represents the two look-ahead characters utilized in the block 35. These two characters are the first segment of the run following Current Character. At blocks 51 and 52, the Code Size logic discussed above with respect to blocks 36 and 37 is performed.

At a block 53, the Code Counter 17 is incremented by 1 to prepare the Code Counter 17 for the processing of the next segment of the run if it should occur. At a block 54, the n look-ahead characters that have just been processed are discarded. The discarding occurs because the code representing these characters has been outputted at the block 50. The discarding of characters is performed by the logic 20 by clearing the Look-Ahead Buffers 14 of the appropriate characters.

Processing continues with a block 55 whereat the index n is advanced to n+1. This action is taken with respect to the n-register 15. Thus, at this point in the processing, n, which had previously been set to 2, is now advanced to 3 in preparation for determining if the next 3 look-ahead characters continue the run to the next numerically incremented run segment.

Accordingly, a decision block 56 is entered that tests the character in the Current Character register 13 against the next n look-ahead characters that follow the characters that were discarded at the block 54. This process is performed by the logic 20 utilizing the appropriate characters fetched into the Look-Ahead Buffers 14. If all n look-ahead characters match the Current Character, the YES branch is taken. If not, the NO branch is taken.

If the YES branch is taken from the block 56, the run of the character in the Current Character register 13 has continued to this next n character segment. Control then returns to the block 50 to continue the processing as described above. Briefly, the block 50 outputs the code that represents this n character run segment which is discarded at the block 54. The Code Counter 17 is again advanced at the block 53. The index n is advanced at the block 55 to investigate the character run further to determine if another contiguous and numerically incremented run segment exists in the input.

If, in the block 56, it is determined that insufficient input characters exist that are the same as the character in the Current Character register 13 so as to populate the next run segment, the NO branch is taken from the block 56. The Code Size test described above with respect to blocks 36 and 37 is then performed at blocks 57 and 58. At a block 59 the Code Counter 17 is incremented by 1. At block 60, under control of the logic 20, the next character that follows the characters that were discarded at the block 54 is fetched to the Current Character register 13 to continue the processing. Accordingly, control then returns to the block 33.

It is appreciated that when the NO branch is taken from the block 56, the n look-ahead characters that are utilized to perform the test of block 56 are in the Look-Ahead Buffers 14. These characters are utilized to continue the processing with the first of such characters being utilized in the block 60 as the Current Character. Characters stored in the Look-Ahead Buffers 14 following the Current Character may then be employed in the block 35 as the look-ahead characters required therein. Logic 20 controls the Current Character register 13 and the Look-Ahead Buffers 14 so that these actions and the other actions of FIG. 2 are appropriately performed by using, fetching and discarding the characters as required.

In summary, it is appreciated that the decision block 35 detects the occurrence of a run and the run is processed in blocks 50–56. The processing of the non-run data is performed by blocks 36–39. The blocks 57–60 perform the processing that follows when insufficient characters remain to populate the next segment of a run.

Referring to FIG. 3, with continued reference to FIGS. 1 and 2, an example of the operation of the compressor 10 in accordance with the flow chart of FIG. 2 is illustrated. At the top of the page, an input data stream is shown where the characters of each character run are identified by character sequence numbers. This is done to facilitate following the progress of the characters through the steps of the example. It is appreciated that these sequence numbers are shown for purposes of character identification and do not appear in the actual input data character stream.

The example is largely self-explanatory, with the actions performed delineated in the left-hand column and the blocks of FIG. 2 that participate in the actions designated in the right-hand column.

For example, in action 2, the code 258 in the Code Counter is output at block 50, the Code Size is tested at blocks 51 and 52, the Code Counter is incremented to 259 at block 53 and the look-ahead characters "a(2)" and "a(3)" are discarded at block 54. Similarly, in action 3, the n-register is incremented to 3 at block 55, the next three look-ahead characters "a(4)", "a(5)" and "a(6)" are examined in block 56, control returns to block 50 to output the code 259, the Code Counter is incremented to 260 in block 53 and the three look-ahead characters are discarded in block 54. As a further example, in action 10, the Code Size is tested in blocks 36 and 37 and the Code Counter is incremented to 265 in block 38. The next character "x" is fetched to the Current Character register in block 39 and outputted in block 34. The next look-ahead characters "yz" are tested at block 35.

Further descriptions of the actions of FIG. 3 relative to the blocks of FIG. 2 are readily apparent and will not be provided for brevity.

Figure 4:
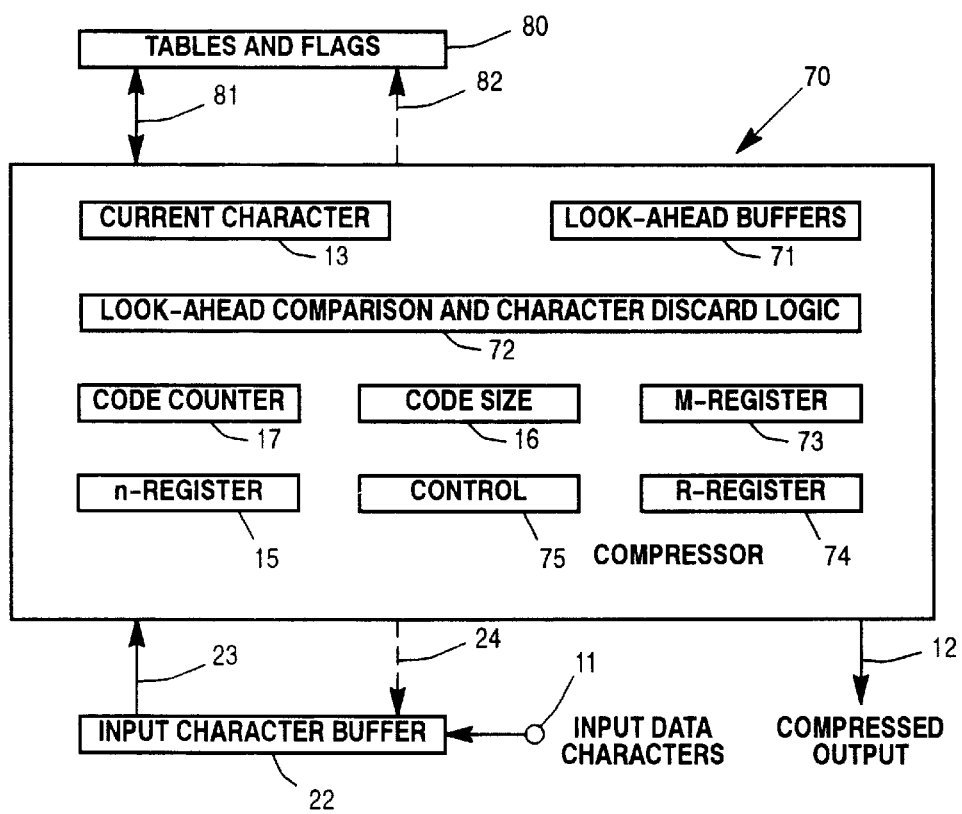
FIG. 4 is a schematic block diagram of a data compressor providing another preferred embodiment of the present invention.

Referring to FIG. 4 with continued reference to FIG. 1, a schematic block diagram of an alternative preferred embodiment of the present invention is illustrated. FIG. 4 illustrates a data compressor 70 having a number of components that are the same as those described above with respect to FIG. 1 and which are given the same reference numerals as in FIG. 1. The descriptions thereof provided above with respect to FIG. 1 are applicable to FIG. 4.

The compressor 70 includes Look-Ahead Buffers 71 which are similar to the Look-Ahead Buffers 14 of FIG. 1. Additional functionality therefor is required in the compressor 70 of FIG. 4 which will be described with respect to FIG. 6. The compressor 70 also includes look-ahead comparison and character discard logic 72 similar to the logic 20 of FIG. 1. Additional functionality therefor is required in the compressor 70 which will be described with respect to FIG. 6.

Figure 6A:
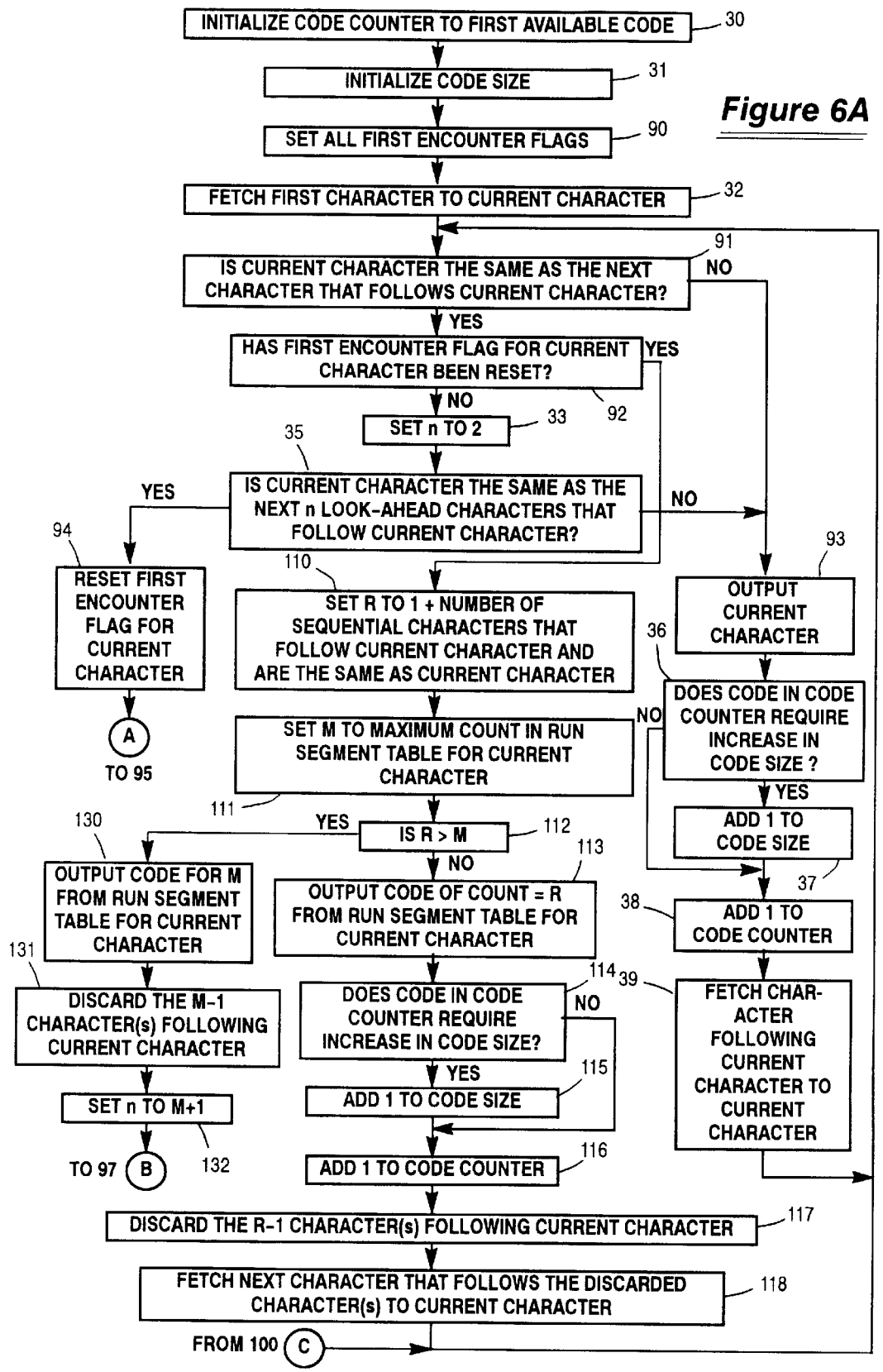
FIG. 6, comprised of FIGS. 6A and 6B, is a control flow chart illustrating the operations executed by the compressor of FIGS. 4 and 5 so as to perform data compression in accordance with the present invention. The embodiment of FIGS. 4-6 uses storage to save character run data that can be re-used when the character run is again encountered.
Figure 6B:
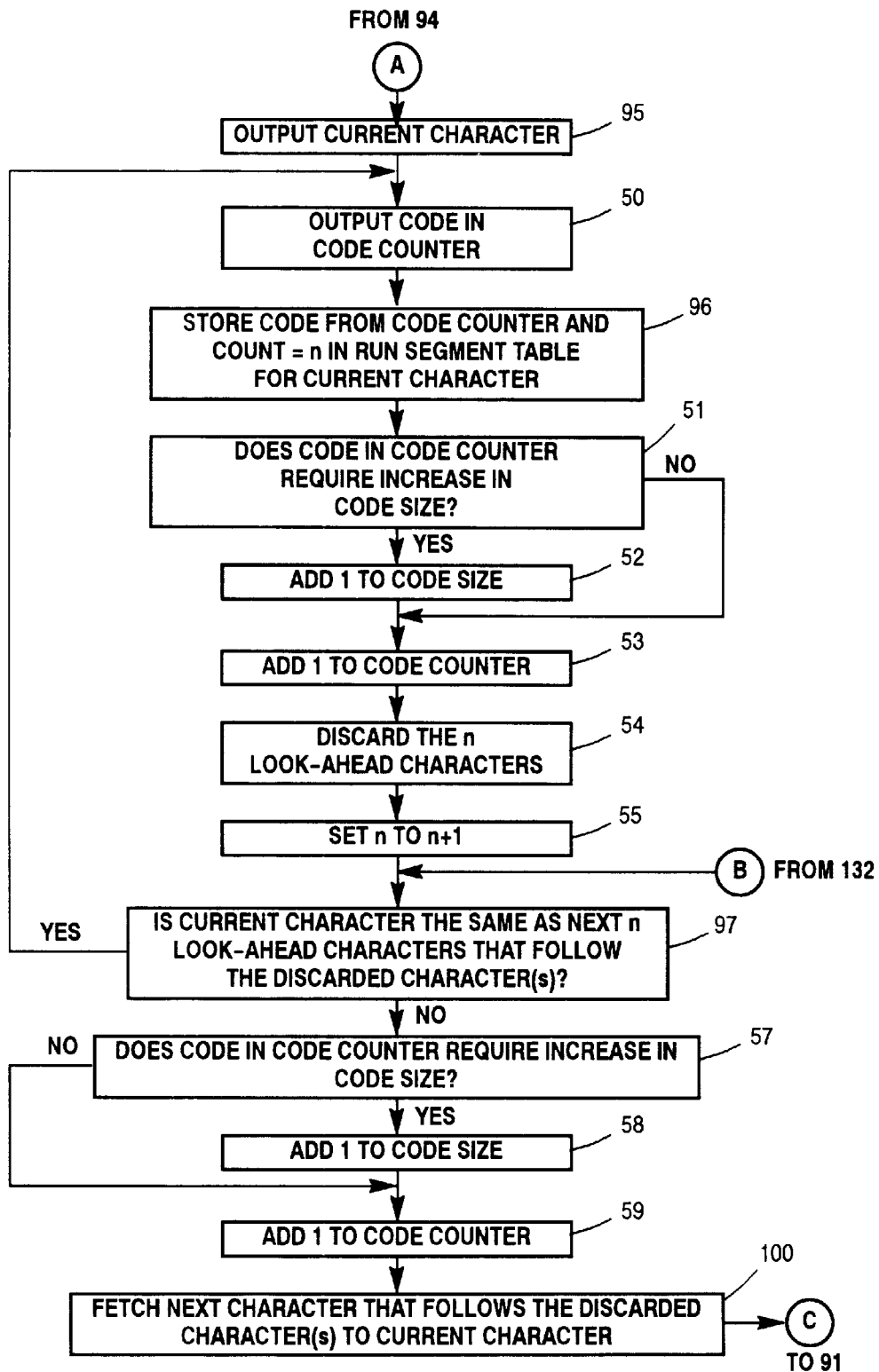

The compressor 70 further includes working registers denoted as an M-register 73 and an R-register 74 for holding variables used in the operation of the compressor 70 in a manner to be described with respect to FIG. 6. The compressor 70 also includes control 75 for controlling the operations of the compressor in accordance with the operational flow chart of FIG. 6 in a manner to be described.

Unlike the compressor 10 of FIG. 1, the compressor 70 includes Tables and Flags 80 for storing run segment counts and codes and for providing First Encounter Flags in a manner to be described. Data communication with the Tables and Flags 80 is effected via a bidirectional bus 81. Control of the data transfer is effected by a bidirectional control bus 82. Details of the Tables and Flags 80 are provided in FIG. 5.

Figure 5:
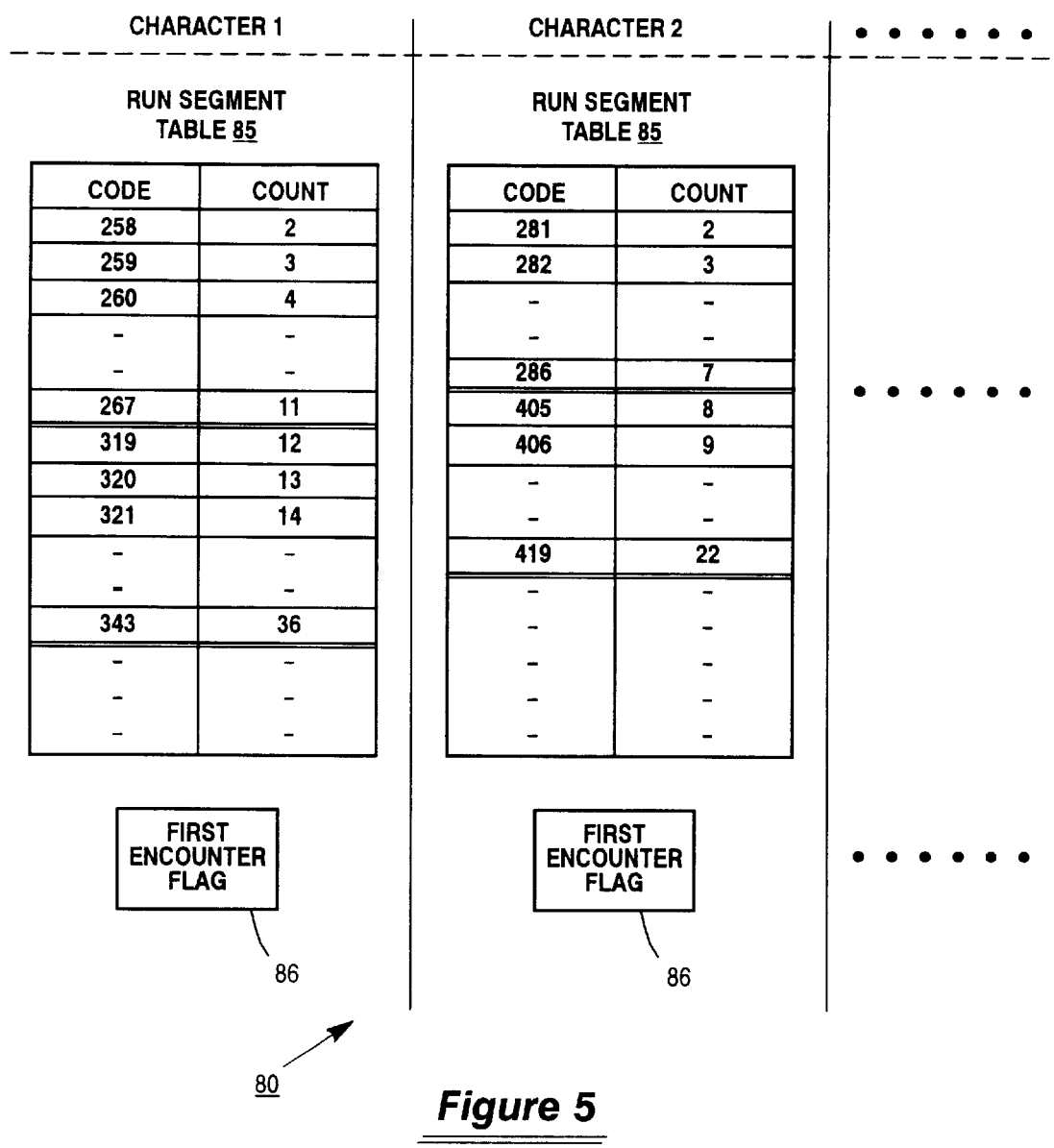
FIG. 5 is a data structure diagram illustrating details of the Tables and Flags of FIG. 4.

Referring to FIG. 5, the Tables and Flags 80 include a Run Segment Table 85 and a First Encounter Flag 86 for each of the characters of the alphabet over which compression is occurring. For example, the Run Segment Table 85 for "character 1" stores the counts and codes of the run segments of the runs of character 1 that are encountered in the data character input. Initially, all of the First Encounter Flags 86 are set. When a run of "character 1" is first encountered, the First Encounter Flag 86 for "character 1" is reset. Details of the use of the Tables and Flags 80 of FIG. 5 will be described below with respect to FIG. 6.

Briefly, the operation of the compressor 70 is as follows. The compressor 70 operates generally in the manner described above with respect to the compressor 10 except that in the compressor 70 run segment data is stored in the Tables 85 as the run segments are processed. In later encounters of a run of the same character, the stored data is utilized to enhance the compression.

Because of this difference in operation, the run detection logic of the compressor 70 operates somewhat differently from the run detection logic of compressor 10. In the compressor 70, if Current Character is not the same as the next following character, non-run processing is performed in substantially the same manner as the non-run operations of the compressor 10. If the next character is the same as Current Character, the First Encounter Flag for Current Character is tested. If the compressor 10 is encountering a run of Current Character for the first time, the same run processing as that of compressor 10 is performed except for the run segment data storage. In this case Current Character and the next two characters would be the same. If, however, this encountered run of Current Character is not the first such run, the Run Segment Table 85 for Current Character is consulted in the processing of the run.

The Current Character register 13, the Look-Ahead Buffers 71, the n-register 15, the M-register 73, the R-register 74 and the logic 72 are utilized in performing the character run processing as described below with respect to FIG. 6.

Referring to FIG. 6, with continued reference to FIGS. 4 and 5, a control flow chart is illustrated showing the detailed operations to be executed by the compressor 70. The control 75 is considered as containing appropriate circuitry to control execution of the operations. In the manner described above with respect to FIG. 2, the flow chart of FIG. 6 is predicated on a variable length output. Many of the blocks of FIG. 6 are the same as the blocks of FIG. 2 and are designated by the same reference numerals. The descriptions given above with respect to these blocks of FIG. 2 are also applicable to the similarly numbered blocks of FIG. 6. Only the blocks of FIG. 6 that are different from the blocks of FIG. 2 will be emphasized in the following description of FIG. 6.

At blocks 30–32 of FIG. 6, the Code Counter 17 and Code Size register 16 are initialized and the first character is fetched to the Current Character register 13. At a block 90, all of the First Encounter Flags 86 are set in preparation of the first encounter of a run of a character.

Processing continues at a block 91 whereat the character in the Current Character register 13 is compared to the next following character to determine if they are the same. The Look-Ahead Buffers 71 and the logic 72 are used to perform this function. If the characters are not the same, the NO branch is taken from the block 91 to perform non-run processing. If the two characters are the same, the YES branch from the block 91 is taken to a block 92 whereat the state of the First Encounter Flag 86 for the character in the Current Character register 13 is tested. If the First Encounter Flag has been reset, the YES branch from the block 92 is taken to perform run processing of the Current Character where a run of this character has previously been encountered and the run data has been stored in the Run Segment Table 85 for the character.

If the First Encounter Flag 86 for Current Character is still set, the NO branch from the block 92 is taken to the block 33 whereat n is set to 2. Processing continues from the block 33 to the block 35 that determines if the Current Character is the same. as the next n look-ahead characters. Since n has been set to 2 in the block 33, the block 35 determines if Current Character and the next two characters are the same. Since the First Encounter Flag for Current Character is still set, run data for this character has not yet been stored. Under these conditions, if the YES branch from the block 35 is taken, run processing similar to that of FIG. 2 is performed. If the NO branch from the block 35 is taken, non-run processing is performed.

Thus it is appreciated, that the blocks 33, 35, 91 and 92 function to detect runs in the following manner. If Current Character is different from the following character, non-run processing is performed. If Current Character is the same as the following character and a run for this character has previously been processed, run processing is performed utilizing the previously stored data. If a run of the character has not yet been encountered and processed, run processing is performed if Current Character is the same as the next two characters, otherwise non-run processing is performed.

If the NO branch is taken either from block 35 or block 91, non-run processing is performed. At a block 93, the character in Current Character register 13 is output. Thereafter, the non-run processing of blocks 36–39 is performed in the manner described above with respect to FIG. 2. After block 39, processing returns to block 91.

When a three-character run of Current Character has been detected for the first time, the YES branch from block 35 is taken. Processing continues with blocks 94 and 95 whereat the First Encounter Flag for Current Character is reset and the character in the Current Character register 13 is output, respectively. Control then enters a loop for processing the segments of the run generally in the manner described above with respect to the blocks 50–56 of FIG. 2.

Accordingly, the processing of FIG. 6 continues with the block 50 whereat the code in the Code Counter 17 is output. Thereafter, a block 96 is entered whereat the code from the Code Counter 17 and the count equal to n is stored in the Run Segment Table 85 for the Current Character. After block 96, blocks 51–55 perform processing in the manner described above with respect to the similarly numbered blocks of FIG. 2. For example, in blocks 54 and 55 the n look-ahead characters are discarded and n is advanced to n+1.

At a block 97 the logic 72 tests to determine if the Current Character is the same as the next n look-ahead characters that follow the discarded character or characters, e.g., the characters discarded at block 54. If processing enters block 97 from block 55, multiple characters will always have been discarded at block 54. It is appreciated that the functionality of the block 97 is substantially the same as that of the block 56 of FIG. 2, except that in block 56 of FIG. 2 multiple characters will always have been discarded. For reasons that will become clear hereafter, it is possible in block 97 that only a single character may have been discarded when processing enters block 97 from block 132. Thus, block 97 is provided with a different reference numeral as compared to that of the comparable block 56 in FIG. 2. In the manner described above with respect to block 56 of FIG. 2, the YES branch from the block 97 loops back to the block 50 to continue the processing of a run.

It is appreciated that the blocks 50–55, 96 and 97 of FIG. 6 perform substantially the same processing as the blocks 50–56 of FIG. 2. The principal difference between the FIG. 2 and FIG. 6 embodiments is that in FIG. 2 run data is not stored and in FIG. 6 run data is stored. Thus it is appreciated that in FIG. 6, the block 96, that performs the storing, is interposed in the processing flow between the blocks 50 and 51 which appear in both FIGS. 2 and 6.

With reference to FIG. 5 and continued reference to FIG. 6, operation of the blocks 50–55, 96 and 97 of FIG. 6 may be exemplified by a run of "character 1" as indicated in FIG. 5. "Character 1" is in the Current Character register 13 and this is the first encounter of a three-character run of "character 1". Consecutive iterations of the loop of FIG. 6 comprising the blocks 50–55, 96 and 97 result in the entries in the Run Segment Table 85 for "character 1" at codes 258–267. Thus it is appreciated that as n is advanced at block 55, numerically increasing segments of the run of "character 1" are encountered with the run segment data stored as illustrated in the Table 85. As discussed above, the code representing each segment of the run is output at the block 50.

Thus it is seen that this exemplified run of "character 1" is comprised of Current Character in the Current Character register 13, followed by a run segment of two characters represented by code 258, followed by a run segment of three characters represented by code 259, and so forth, up to a segment of eleven characters represented by code 267. Thus, this run is comprised of between 66 and 77 characters.

With continued reference to FIG. 6, if at block 97 insufficient characters remain in the run to populate the next segment, the NO branch is taken from the block 97. Processing continues with blocks 57–59 and a block 100. The blocks 57–59 are the same as the similarly numbered blocks of FIG. 2, as described above, and the block 100 is substantially the same as the block 60 of FIG. 2. A new reference numeral is utilized for the block 100 for the reasons given above with respect to the block 97.

After the next character that follows the discarded character or characters is fetched to the Current Character register 13, control returns to the block 91 to continue processing of the input data character stream.

When a two-character run is encountered in the block 91 and the First Encounter Flag for the character has been reset, the YES branch is taken from the block 92 to a block 110 to begin run processing of a run of a character where previous run data for the character has been stored. A parameter R is set to 1 plus the number of sequential characters that follow Current Character and that are the same as Current Character. Thus it is appreciated that R is equal to the number of characters in the run of Current Character that has just been encountered. The Look-Ahead Buffers 71 and the logic 72 are utilized in performing the functionality of the block 110 where the value of R is held in the R-register 74.

Processing continues to a block 111 where a parameter M is set to the maximum count in the Run Segment Table for the character in the Current Character register 13. M is determined from the appropriate Run Segment Table 85 of FIG. 5 by scrolling to the bottom of the Table to determine this maximum count M. M is then held in the M-register 73.

Processing continues at a block 112 whereat the value in the R-register 74 is compared with the value in the M-register 73. If R is greater than M, the YES branch from the block 112 is taken and if R is less than or equal to M, the NO branch from the block 112 is taken. If the YES branch is taken, the currently encountered run of Current Character is greater than the maximum run segment stored in the associated Run Segment Table 85. If the NO branch is taken, the currently encountered run of Current Character is less than or equal to the maximum run segment stored in the associated Run Segment Table.

If the NO branch is taken from the block 112, processing continues at a block 113 whereat the code from the associated Run Segment Table for the count that is equal to R is output by the compressor 70. The function of block 113 is performed by associatively comparing the value in the R-register 74 with the counts in the associated Run Segment Table. When R is located in the Table, the corresponding code has been located and is output. Alternatively, a simple sequencing through the counts stored in the Table can be utilized to find the appropriate location where the count is equal to R.

Processing then proceeds to blocks 114 and 115 wherein the Code Size is tested and adjusted in the manner described above with respect to blocks 36 and 37.

At a block 116, the Code Counter 17 of the compressor 70 is incremented by 1 and at a block 117 the R−1 character or characters that follow the Current Character are discarded. These discarded characters together with the character in the Current Character register 13 are represented by the code that is outputted in the block 113. The discarding of these characters is performed utilizing the Look-Ahead Buffers 71 under control of the logic 72.

At a block 118, the character that follows the character or characters discarded at the block 117 is fetched to the Current Character register 113. This function is performed by the Look-Ahead Buffers 71 under control of the logic 72. Thereafter, control returns to the block 91 to continue processing the input data character stream.

If the currently encountered run of Current Character is greater than the longest run segment stored in the associated Run Segment Table 85, the YES branch is taken from the block 112. Processing continues with a block 130 whereat the code corresponding to M from the associated Run Segment Table is outputted. M is the value stored in the M-register 73. The associated Run Segment Table is accessed with this value of M either, for example, associatively or by scanning to locate and output the corresponding code for the count of M.

Processing continues at a block 131 whereat the M−1 character or characters following Current Character are discarded. The discarding operation is accomplished in the manner described above with respect to blocks such as the blocks 54 and 117. The M−1 characters discarded at the block 131 together with the character in the Current Character register 13 comprise a segment of the currently encountered run of Current Character. The code representing these M characters was outputted 10 at block 130.

The remainder of the run is processed by setting n to M+1 at a block 132. The function of block 132 is performed by incrementing the value of M in the register 73 by 1 and transferring this value to the n-register 15. Control then transfers to the block 97 to continue the processing of the run as previously described.

With continued reference to FIG. 6, it is appreciated that block 93 is the entrance to non-run processing and block 94 is the entrance to processing of a first encountered run of a character. The block 110 is the entrance to the processing of a run of a character where a previous run of the character has been processed and stored. For such a run, the block 112 is the branch point for processing runs that are either greater than the maximum run segment stored or less than or equal to the maximum stored run segment.

The embodiment of FIGS. 4–6 was described in terms of the run detection logic comprised of blocks 91, 92, 33 and 35 of FIG. 6. It is appreciated that 30 the run detection logic of the FIGS. 1 and 2 embodiment comprised of blocks 33–35 of FIG. 2 could, instead, have been used in FIG. 6. With such an embodiment, the stored run segments of length 2 would not be accessed in the Run Segment Tables 85. In this alternative arrangement, blocks 33 and 35 would be utilized with block 92 following the block 35. The NO branch of block 92 would then lead to block 94. The YES branch thereof would lead to block 110 as presently illustrated.

Referring to FIG. 7, with continued reference to FIGS. 4–6, an example of the operation of the compressor 70 in accordance with the flow chart of FIG. 6 is illustrated. The format of FIG. 7 is the same as that of FIG. 3 and the descriptions given above with respect to FIG. 3 are applicable. FIG. 7 differs from FIG. 3 principally in that run segment data stored in the Run Segment Table and used to process later runs is illustrated and the parameters R and M as well as the setting and resetting of the First Encounter Flag are shown.

Specifically, actions 1–6 of FIG. 7 are substantially the same as actions 1–5 of FIG. 3 except that in FIG. 7 the run segment data is stored in the Run Segment Table and the setting and resetting of the First Encounter Flag is illustrated.

Similarly, the non-run processing of actions 9–12 of FIG. 7 are substantially the same as actions 9–12 of FIG. 3 except that in FIG. 7 the non-run decision is made on the basis of one look-ahead character whereas in FIG. 3 the decision is made on the basis of two look-ahead characters.

Action 13 of FIG. 7 illustrates the detection of the second encounter of a run of the character "a". This run is illustrated as characters "a(13)" through "a(21)" and is thus comprised of 9 characters. The largest segment of a run of the "a" character was stored at action 5 with a run segment count of 4. In action 14, the code 260 for the stored segment is output and the 4 characters "a(14)" through "a(16)" are discarded. The index n is set to 5 at action 15 in preparation for absorbing characters "a(17)" through "a(21)". At action 16, the code 267 representing these characters is output, the characters are discarded and this run segment is stored in the Run Segment Table as illustrated.

The correlation of the actions of FIG. 7 with the blocks of FIG. 6, as indicated in the right-hand column of FIG. 7, is similar to the descriptions given above with respect to FIG. 3 and are readily apparent by a comparison of the specific example of FIG. 7 with the functionality of the blocks of FIG. 6.

It is appreciated that a compatible decompressor can readily be provided that receives the compressed output of the compressor 10 or 70 operating in synchronism therewith to recover the input data characters corresponding thereto.

If the sequence of output codes, as delineated in the "OUTPUT" columns of FIGS. 3 and 7 are processed by the decompressor, the input data character streams, illustrated in the drawings, will be recovered. It is understood that the protocols of the decompressor should be compatible with those of the compressor. In the examples of FIGS. 3 and 7, an ASCII alphabet supported by eight bits is assumed. The ASCII alphabet is comprised of 256 characters. The Code Counter 17 is initialized at block 30 of FIGS. 2 and 6 to a code of 258. The code 257 may, for example, be reserved as a control code as is well understood in the art. The decompressor should have the same alphabet size and initial conditions, such as initial Code Counter value and initial Code Size, as the compressor. Furthermore, as is well appreciated in the art, the Code Size of the compressor embodiments of the present invention and the Code Size of the decompressor should be advanced in synchronism with respect to each other, for example, as described above with respect to FIG. 2.

As is well known, the compressor and decompressor can either be initialized with all of the single character strings or single characters can be distinguished from compressed codes by the respective values thereof. An ASCII character has a value that is equal to or less than 256, whereas in the ASCII examples of FIGS. 3 and 7, compressed codes have a value equal to or greater than 258. It is furthermore well known that other single character code protocols may also be utilized.

The single character code protocol that is used in the compressor embodiments of the present invention should also be utilized in the decompressor.

It is appreciated that the Code Counter 17 is incremented as described above so as to maintain synchronism between the run and non-run processing. This is particularly seen at blocks 38, 53, 59 and 116 of the above described figures. For example, at block 38 the Code Counter 17 is incremented by 1 so as to maintain synchronism with the Current Character outputting of block 34.

The above embodiments compress a stream of input data characters. The input data characters can be over any size alphabet having any corresponding character bit size. For example, the data characters can be textual, such as ASCII characters, over an alphabet, such as the 256 character ASCII alphabet of eight-bit characters. The input data can also be binary characters over the two character binary alphabet 1 and 0 having a one-bit sized character. It is appreciated that textual data can also be compressed over the two character alphabet of the underlying binary data.

It is appreciated that the above-described embodiments of the invention may be implemented in hardware, firmware, software or a combination thereof. Discrete circuit components may readily be implemented for performing the various described functions. In a software embodiment, appropriate modules, programmed with coding readily generated from the above-described flow charts, may be utilized.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A data compression method for compressing an input stream of data characters into an output stream of codes, said input stream including adjacent data characters forming a run of the same data character, comprising detecting when a run exists in said input stream by detecting when a predetermined number of said adjacent data characters are the same, generating a sequence of numerically increasing consecutive codes, assigning consecutive codes of said sequence to respective contiguous segments of said detected run, each said segment having one data character less than the next following adjacent segment of said detected run, determining when a run is not occurring in said input stream by determining when one of said predetermined number of adjacent data characters differs from the others, said predetermined number of adjacent data characters having a first data character, outputting said assigned consecutive codes and outputting a representation of each said first data character so as to provide said output stream of codes, and incrementing said sequence to a next following code thereof for each said representation of each said first data character that is output.

2. The method of claim 1 wherein said detected run includes a last segment having one data character more than the prior adjacent segment of said detected run, further including detecting that said input stream following said last segment contains an insufficient number of adjacent data characters that are the same as the data character of said detected run to populate a next following adjacent segment, and incrementing said sequence to a next following code after said insufficient number of data characters has been detected.

3. The method of claim 2 further including discarding the data characters of each said segment of said detected run for which an assigned code is outputted.

4. The method of claim 3 further including continuing said method with said step of detecting when a run exists using the next data characters of said input stream following the discarded characters of said last segment.

5. The method of claim 1 further including storing run segment data comprising the number of data characters in said segments together with the respective codes assigned thereto, accessing said stored run segment data to determine if a currently detected run includes the number of data characters of a stored segment, and outputting the stored code assigned to said stored segment.

6. The method of claim 5 further including incrementing said sequence to a next following code after outputting said stored code when the number of data characters of said currently detected run is less than or equal to the maximum number of data characters of a stored segment.

7. The method of claim 6 wherein said step of outputting the stored code further includes outputting the stored code assigned to said stored segment having said maximum number of data characters when the number of data characters of said currently detected run is greater than said maximum number of data characters of said stored segment.

8. The method of claim 5 wherein said predetermined number of said adjacent data characters comprises two data characters.

9. The method of claim 5 wherein said predetermined number of said adjacent data characters comprises three data characters.

10. The method of claim 1 wherein said input stream includes a plurality of said runs and wherein, said detecting step includes detecting when each said run exists in said input stream by detecting when a predetermined number of said adjacent data characters are the same, and said assigning step includes assigning consecutive codes of said sequence to each said contiguous segment of each said detected run.

11. The method of claim 10 wherein said predetermined number of said adjacent data characters comprises three data characters.

12. The method of claim 1 wherein said predetermined number of said adjacent data characters comprises two data characters.

13. The method of claim 1 wherein said predetermined number of said adjacent data characters comprises three data characters.

14. Data compression apparatus for compressing an input stream of data characters into an output stream of codes, said input stream including adjacent data characters forming a run of the same data character, comprising means for detecting when a run exists in said input stream by detecting when a predetermined number of said adjacent data characters are the same, means for generating a sequence of numerically increasing consecutive codes, means for assigning consecutive codes of said sequence to respective contiguous segments of said detected run, each said segment having one data character less than the next following adjacent segment of said detected run, means for determining when a run is not occurring in said input stream by determining when one of said predetermined number of adjacent data characters differs from the others, said predetermined number of adjacent data characters having a first data character, means for outputting said assigned consecutive codes and outputting a representation of each said first data character so as to provide said output stream of codes, and means for incrementing said sequence to a next following code thereof for each said representation of each said first data character that is output.

15. The apparatus of claim 14 wherein said detected run includes a last segment having one data character more than the prior adjacent segment of said detected run, further including means for detecting that said input stream following said last segment contains an insufficient number of adjacent data characters that are the same as the data character of said detected run to populate a next following adjacent segment, and means for incrementing said sequence to a next following code thereof after said insufficient number of data characters has been detected.

16. The apparatus of claim 15 further including means for discarding the data characters of each said segment of said detected run for which an assigned code is outputted.

17. The apparatus of claim 16 wherein said means for detecting when a run exists is operative to continue with a next data character of said input stream following the discarded characters of said last segment.

18. The apparatus of claim 14 further including means for storing run segment data comprising the number of data characters in said segments together with the respective codes assigned thereto, means for accessing said stored run segment data to determine if a currently detected run includes the number of data characters of a stored segment, and means for outputting the stored code assigned to said stored segment.

19. The apparatus of claim 18 further including means for incrementing said sequence to a next following code thereof after outputting said stored code when the number of data characters of said currently detected run is less than or equal to the maximum number of data characters of a stored segment.

20. The apparatus of claim 19 wherein said means for outputting the stored code further includes means for outputting the stored code assigned to said stored segment having said maximum number of data characters when the number of data characters of said currently detected run is greater than said maximum number of data characters of said stored segment.

21. The apparatus of claim 18 wherein said predetermined number of said adjacent data characters comprises two data characters.

22. The apparatus of claim 18 wherein said predetermined number of said adjacent data characters comprises three data characters.

23. The apparatus of claim 14 wherein said input stream includes a plurality of said runs and wherein, said means for detecting comprises means for detecting when each said run exists in said input stream by detecting when a predetermined number of said adjacent data characters are the same, and said means for assigning comprises means for assigning consecutive codes of said sequence to each said contiguous segment of each said detected run.

24. The apparatus of claim 23 wherein said predetermined number of said adjacent data characters comprises three data characters.

25. The apparatus of claim 14 wherein said predetermined number of said adjacent data characters comprises two data characters.

26. The apparatus of claim 14 wherein said predetermined number of said adjacent data characters comprises three data characters.

27. The method of claim 14 wherein said means for generating comprises a code counter incrementable by one so as to generate said sequence.

* * * * *